US006194814B1

(12) United States Patent
Hanafy et al.

(10) Patent No.: US 6,194,814 B1
(45) Date of Patent: Feb. 27, 2001

(54) NOSEPIECE HAVING AN INTEGRATED FACEPLATE WINDOW FOR PHASED-ARRAY ACOUSTIC TRANSDUCERS

(75) Inventors: Amin M. Hanafy, Los Altos Hill; Russell R. Sperry, Davis; Richard E. DeMartini, Millbrae, all of CA (US); Matthew T. Spigelmyer, Penna Furnace, PA (US)

(73) Assignee: Acuson Corporation, Mountain View, CA (US)

( * ) Notice: Subject to any disclaimer, the term of this patent is extended or adjusted under 35 U.S.C. 154(b) by 0 days.

(21) Appl. No.: 09/093,417

(22) Filed: Jun. 8, 1998

(51) Int. Cl.[7] .................................................... H01L 41/08

(52) U.S. Cl. .......................... 310/334; 310/327; 310/336; 310/367

(58) Field of Search .................................... 310/322, 326, 310/327, 334, 335, 336, 367

(56) References Cited

U.S. PATENT DOCUMENTS

| | | | | |
|---|---|---|---|---|
| Re. 34,566 | | 3/1994 | Ledley | 128/660.07 |
| 3,256,367 | | 6/1966 | Jayne, Jr. | 260/897 |
| 3,964,014 | * | 6/1976 | Tehon | 310/334 |
| 4,184,094 | * | 1/1980 | Kopel | 310/335 |
| 4,205,686 | * | 6/1980 | Harris et al. | 128/660 |
| 4,387,720 | | 6/1983 | Miller | 128/660 |
| 4,549,107 | * | 10/1985 | Kaneko et al. | 310/335 |
| 4,930,515 | | 6/1990 | Terwilliger | 218/662.06 |
| 5,078,141 | | 1/1992 | Suzuki et al. | 128/653.2 |
| 5,152,294 | | 10/1992 | Mochizuki et al. | 128/662.03 |
| 5,159,931 | | 11/1992 | Pini | 128/660.07 |
| 5,315,512 | | 5/1994 | Roth | 364/413.25 |
| 5,438,998 | * | 8/1995 | Hanafy | 128/662.03 |
| 5,562,096 | | 10/1996 | Hossack et al. | 128/662.06 |
| 5,945,770 | * | 8/1999 | Hanafy | 310/322 |
| 5,976,091 | * | 11/1999 | Hanafy | 600/459 |

FOREIGN PATENT DOCUMENTS

| | | | |
|---|---|---|---|
| 0 749 722 A2 | 12/1996 | (EP) | A61B/8/00 |

* cited by examiner

*Primary Examiner*—Thomas M. Dougherty
(74) *Attorney, Agent, or Firm*—Brinks Hofer Gilson & Lione

(57) ABSTRACT

An ultrasound transducer is provided that includes a plurality of transducer elements having a first surface facing a region of examination when the transducer is in use and a second surface opposite of the first surface. The first surface or the second surface or both may be non-planar in an elevation direction. A nosepiece having an integrated faceplate is disposed over the transducer and a filler material may fill an area between the first surface of the transducer elements and the interior surface of the integrated faceplate. The filler material may have focusing or non-focusing properties.

89 Claims, 11 Drawing Sheets

NEW DESIGN UNIFORM THICKNESS FACE PLATE (PREFERRED EMBODIMENT)

INDUSTRY STANDARD RTV LENS WITH FLAT CONSTANT THICKNESS PZT (90%)

INDUSTRY STANDARD WITH CURVED CONSTANT THICKNESS PZT (10%)

NEW DESIGN UNIFORM THICKNESS FACE PLATE
(PREFERRED EMBODIMENT)

HIGH SENSITIVITY DESIGN
SECOND PREFERRED EMBODIMENT TWO
LAYERS VARIABLE CRYSTAL THICKNESS PZT

PREFERRED EMBODIMENT FOR EXTRA WIDE BAND VARIABLE THICKNESS PZT HIGH PZT RATIO

INVERTED PZT BULLET WITH INTEGRATED FACE PLATE NOSE PIECE

CONSTANT THICKNESS PZT
HIGH SENSITIVITY PREFERRED EMBODIMENT
(RTV PEDASTAL REMOVED)

CURVED PZT WITH REMOVED POLYMER PEDASTAL FOR HIGHER SENSITIVITY

FORWARD LOOKING PZT BULLET WITH CONCAVE FACE INTEGRATED NOSE PIECE

BACKWARD LOOKING PZT BULLET WITH CONCAVE VARIABLE THICKNESS FACE INTEGRATED NOSE PIECE

CURVED PZT WITH INTEGRATED FACE PLATE NOSE PIECE ASSEMBLY

NOSEPIECE HAVING AN INTEGRATED FACEPLATE WINDOW FOR PHASED-ARRAY ACOUSTIC TRANSDUCERS

FIELD OF THE INVENTION

The present invention relates to a nosepiece having an integrated faceplate window for phased array transducers, and, more particularly, an integrated faceplate window that provides improved performance, better insertion loss and undisturbed aperture function to improve reliability.

BACKGROUND OF THE INVENTION

As will be used throughout this application, the x, y and z axes will be referred to as the x-elevation axis, the y-azimuthal axis, and the z-range axis. FIG. 1 is a perspective view of a transducer assembly according to the prior art. The transducer assembly 10 includes a backing block 12, a layer of transducer material 14, a first matching layer 16, a second matching layer 18, a window 20 and a plastic housing 22. Also included is a first flex circuit 24 disposed on one surface of the transducer layer 14 and a second flex circuit 26 disposed on an opposite surface of the transducer layer 14 as is well known. The layer of transducer material 14 has a thickness measured in the z-range direction that is constant at each point along the x-elevation axis. The layer of transducer material 14 is flat in the x-elevation direction, i.e., has no curvature. Because the layer of transducer material 14 is flat and has a constant thickness, in order to provide geometrical focusing of an emitted ultrasound beam in the elevation plane, the window 20 disposed over the transducer must be a focusing lens, preferably of a room temperature vulcanized (RTV) silicon material. There are disadvantages associated with such a transducer. The window 20 material is exposed to the environment and thus is exposed to various chemicals including coupling gels when the transducer is in use and disinfectants for cleaning the transducer after use which degrade the integrity of the window. In addition, because the window of the transducer is physically placed against and moved along a surface of the body during imaging, the window is subject to mechanical forces which also degrade the integrity of the window. Also, because the window 20 is formed separately from the plastic housing 22 and is bonded thereto, the bond may be defective or deteriorate over time thus allowing leakage into the housing 22 itself. These chemical and mechanical forces impose stresses on the window of the transducer which introduce problems in the reliability of the transducer and a deterioration in its performance over time.

FIG. 2 is a cross-sectional view taken along the x-elevation axis of another transducer assembly according to the prior art. The transducer assembly 110, like the transducer assembly 10 shown in FIG. 1, includes a backing block 112, a layer of transducer material 114 of uniform thickness, a first acoustic matching layer 116, a second acoustic matching layer 118, a window 120, a plastic housing 122 and a first and second flex circuit 124, 126. Unlike the transducer assembly 10 shown in FIG. 1, the layer of transducer material 114 is curved in the x-elevation direction so that both the front and back surfaces 113, 115 are concave in shape. The curvature of the layer of transducer material 114 provides focusing of an emitted ultrasound beam along the x-elevation axis. Such transducers are known as mechanically focused transducers. Other mechanically focused transducers use a layer of transducer material that has a non-uniform thickness. See U.S. Pat. Nos. 5,438,998 and 5,415,175. Because the layer of transducer material 114 itself provides the focusing, the window material 120 need not be made of focusing material. Like the transducer assembly shown in FIG. 1, however, the window 120 is exposed to the environment and separately bonded to the housing 122 and thus suffers from the same disadvantages.

U.S. Pat. No. 5,562,096 ("the '096 patent") discloses an ultrasonic transducer probe with an axisymmetric lens. The reference numerals in this paragraph refer to the reference numerals in the '096 patent. The transducer probe includes a uniform, flat layer of transducer material 4 with a lens 6 disposed thereover both of which are located in an integrated housing 2. In the region of the housing 2 that is adjacent to the lens 6, the continuous surface 10 of the transducer housing 2 is formed into a window 12. In one embodiment, when a lens 6 is disposed in the housing 2, the thickness of the window 12 is constant. Alternatively, the thickness of the window 12 may vary as a function of distance from axis 8. The window may be formed into an axisymmetric converging lens by increasing the thickness of the window as a function of distance from axis 8. Similarly, the window may be formed into an axisymmetric diverging lens by decreasing the thickness of the window as a function of increasing distance from axis 8. In either of these embodiments the probe can be constructed with or without the lens 6. Preferably, the transducer housing 2 is formed from an acoustically transmissive material such as a thermoplastic material and more particularly, TPX™ from Mitsui Petrochemicals (America).

U.S. Pat. No. 4,387,720 discloses a transducer that includes a flat, uniform thickness array of crystals 2, a focusing lens 15 disposed over the crystals and a non-focusing filler disposed between the transducer layer and the lens. The lens element 14 may be formed of polymethylpentene, polyethylene and polypropylene, all modified with a rubber modifier such as ethylene propylene. The lens element 14 has an outer face 15 that may be flat or slightly curved. An inner lens element 24 is disposed between the outer lens element 14 and a shield 8 and may be formed of a potting compound such as urethane. The outer lens element 14 is a separate piece from nose piece 26. The curvature of the inner surface 15' of the outer lens element 14 provides the focusing of an emitted ultrasound beam in the elevation plane.

It is thus desirable to provide an ultrasound transducer that has a reliable chemical resistant and high impact resistant shell. It is also desirable to provide an ultrasound transducer that has a seamless design to reduce the possibility of leakage of chemicals into the transducer housing. It is also desirable to provide a transducer that is blood compatible.

SUMMARY OF THE INVENTION

According to a first aspect of the present invention there is provided an ultrasound transducer comprising a plurality of transducer elements, each of said elements comprising a first layer of transducer material, the first layer having a first surface and a second surface opposite of the first surface and a thickness measured in a range direction between the first and second surface wherein the thickness of the first layer is uniform. A nosepiece having an integrated faceplate is disposed over the plurality of transducer elements; and a filler material is disposed between the plurality of transducer element and the integrated faceplate.

According to a second aspect of the present invention there is provided an ultrasound transducer comprising:

a plurality of transducer element disposed on a top surface of a backing block, the plurality of transducer elements each having a first surface and a second surface, the second surface opposite of the first surface, wherein the first surface is non-planar in an elevation direction. A nosepiece having an integrated faceplate is disposed over the plurality of transducer elements and a filler material is disposed between the plurality of transducer elements and the integrated faceplate.

According to a third aspect of the invention there is provided an ultrasound transducer comprising:

a plurality of transducer elements, each element comprising a back portion facing away from a region of examination, a front portion opposite of the back portion and two side portions, each of the elements having a thickness measured in a range direction between the front and back portion, the thickness being greater at each of the side portions than between the side portions. A nosepiece having an integrated faceplate is disposed over the plurality of transducer elements, and a filler material is disposed between the plurality of transducer elements and the faceplate.

According to a fourth aspect of the invention there is provided an ultrasound transducer comprising:

a plurality of transducer elements, each of the transducer elements comprising a first layer of transducer material, each element having a front surface facing a region of examination that is non-planar in an elevation direction. A nosepiece having an integrated faceplate is disposed over the plurality of transducer elements, and a filler material is disposed between the plurality of transducer elements and the integrated faceplate.

According to a fifth aspect of the present invention there is provided an ultrasound transducer comprising:

a plurality of transducer elements, each of the transducer elements comprising a first layer of transducer material, each element having a front surface facing a region of examination that is non-planar in an elevation direction, and a nosepiece having an integrated faceplate is disposed over the plurality of transducer elements.

DETAILED DESCRIPTION OF THE PRESENTLY PREFERRED EMBODIMENTS

Figure 1:
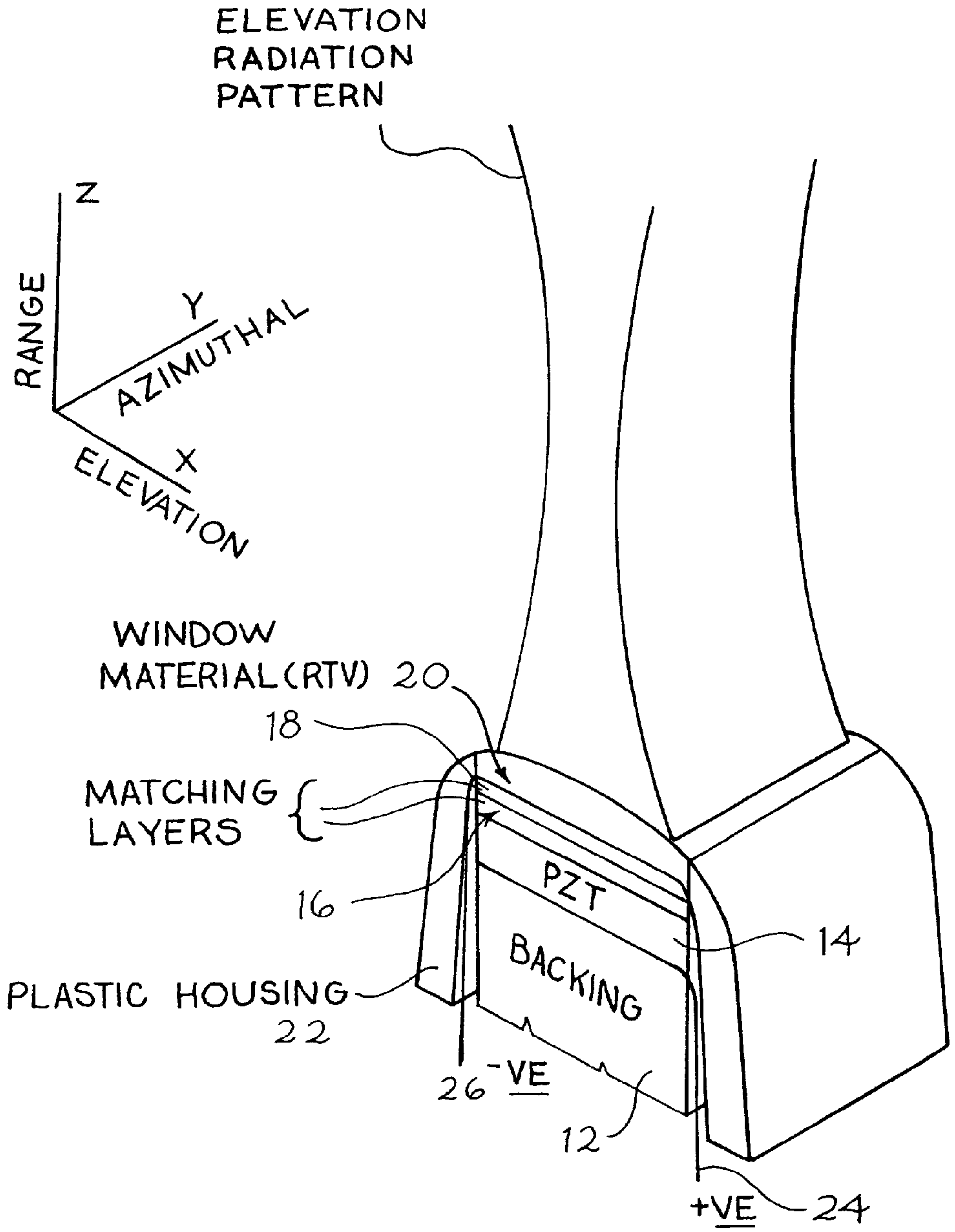
FIG. 1 is a perspective view of a transducer assembly according to the prior art.
Figure 2:
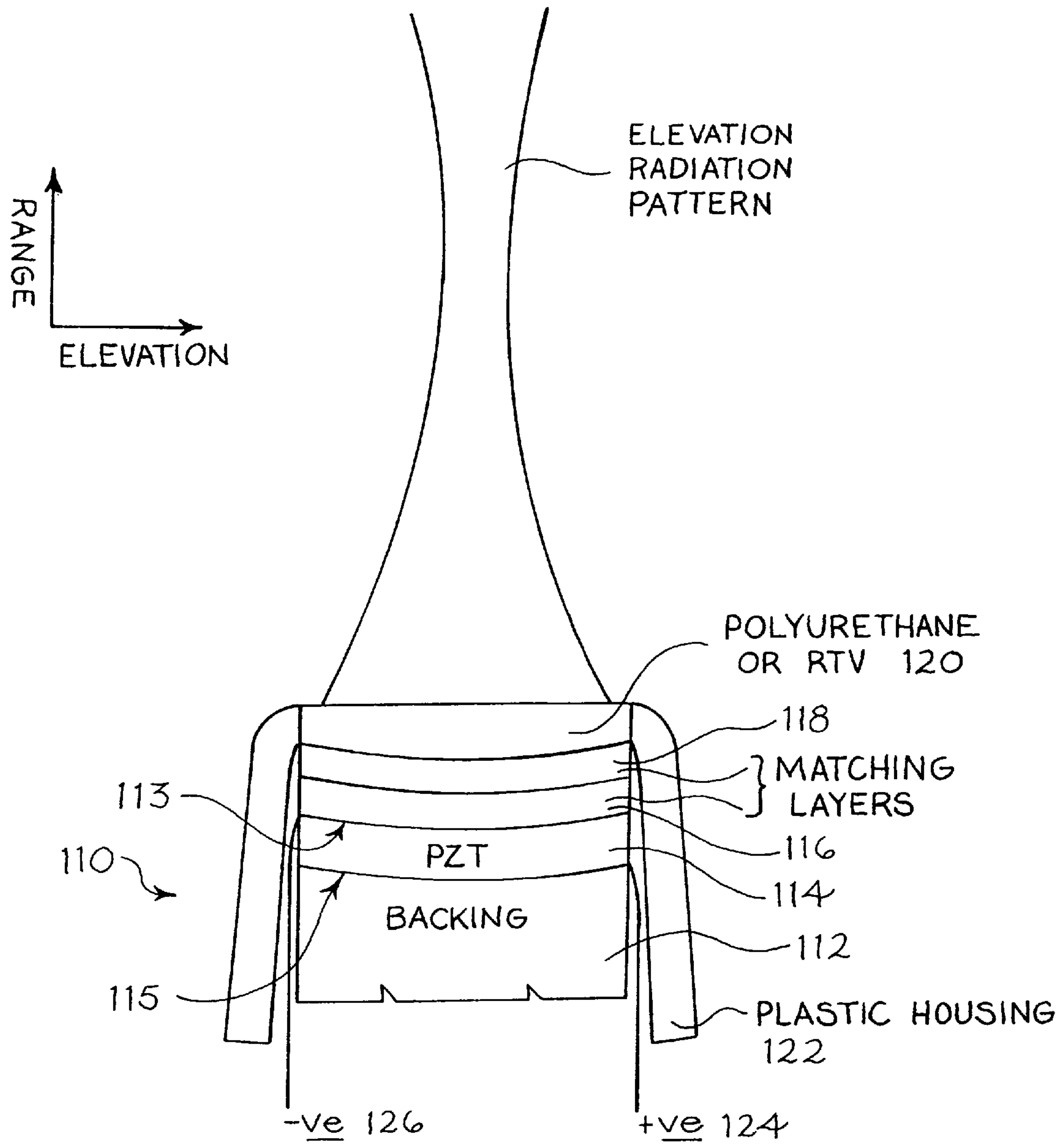
FIG. 2 is a cross-sectional view taken along the x-elevation axis of a transducer assembly according to the prior art
Figure 3:
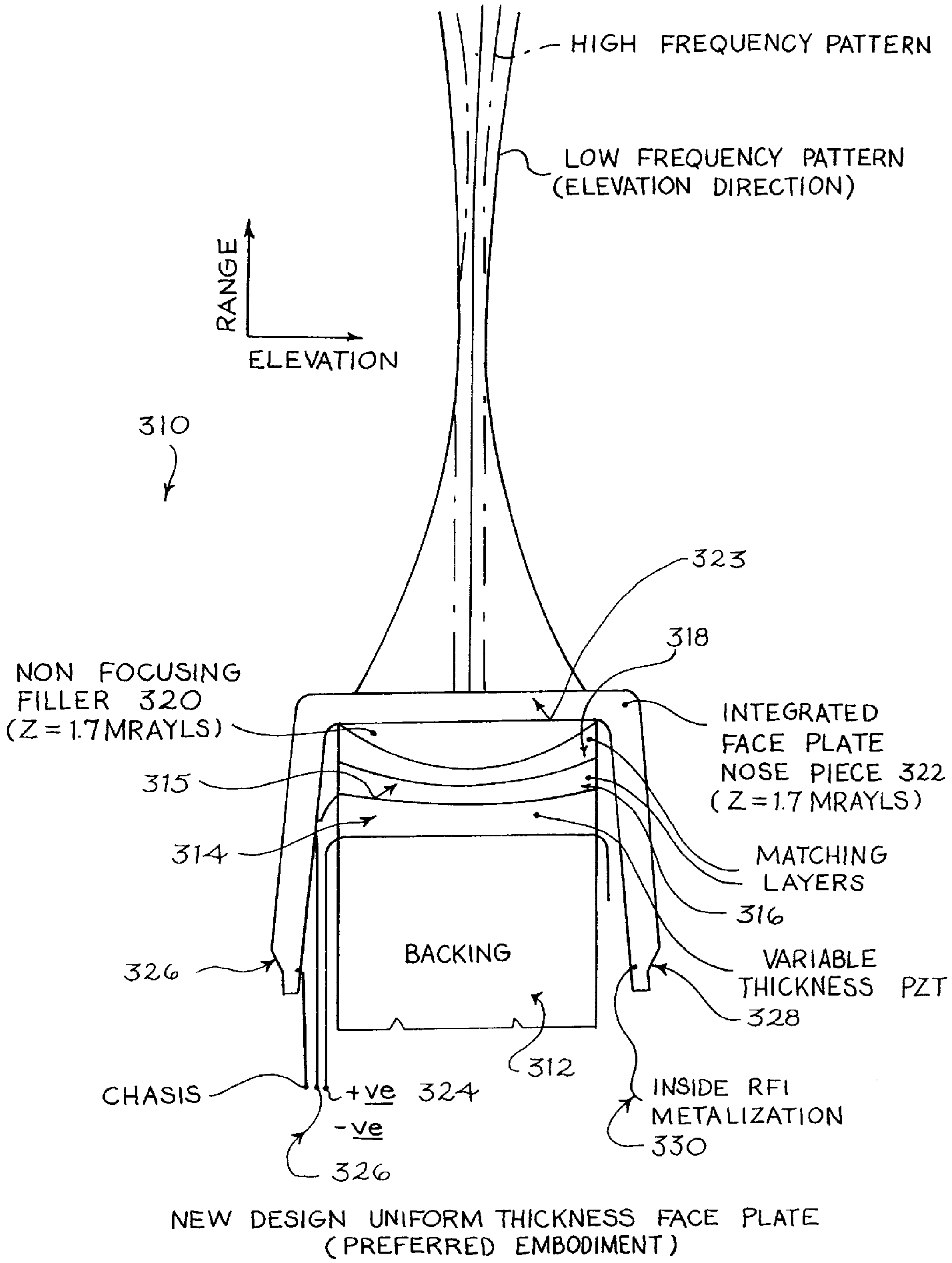
FIG. 3 is a cross-sectional view taken along the x-elevation axis of a transducer assembly according to a first preferred embodiment of the present invention.

None of the Figures are drawn to scale. FIG. 3 is a cross-sectional view taken along the x-elevation axis of a transducer assembly according to a first preferred embodiment of the present invention. The transducer assembly 310 includes a backing block 312, a layer of transducer material 314, a first and a second acoustic matching layer 316, 318, a nose piece 322 having an integrated face plate window 323 and a filler material 320. Also included is a first flex circuit 324 disposed on one surface of the layer of transducer material 314 and a second flex circuit 326 disposed on an opposite surface of the layer of transducer material 314. In this preferred embodiment, the layer of transducer material 314 has a thickness measured along the z-range axis that is not constant at every point along the x-elevation axis. In this preferred embodiment the layer of transducer material 314 has a front surface 315 that faces a region of examination when the transducer is in use that is preferably concave in shape. U.S. Pat. Nos. 5,438,998 ("the '998 patent") and 5,415,175 ("the '175 patent"), which are specifically incorporated herein by reference, disclose such a non-uniform thickness layer of transducer material. The first and second acoustic matching layers 316, 318 also have a non-uniform thickness as described in the '998 and '175 patents. The integrated faceplate window 323 of the nose piece 322 is disposed over the front surface of transducer material 314 and the filler material 320 fills the gap between a top surface of the second acoustic matching layer 318 and the interior surface of the integrated faceplate window 323 of the nosepiece 322. The nose piece 322 has legs 326, 328 that fit within a transducer housing (not shown) as is well known to those of ordinary skill in the art and thus need not be described in further detail. The inner surface of the nose piece 322 and integrated faceplate window 323 is coated with an RFI shield 330 as is well known to those of ordinary skill in the art. For example, the interior of the nosepiece can be metallized for RFI shielding by sputtering, thin film evaporation or electroplating. The RFI shield 330 is coupled to the chassis of an ultrasound system.

The materials used to form the various parts of the transducer assembly 310 will now be described. The backing block 312 is preferably formed of an acoustically attenuative material such as a filled epoxy comprising Dow Corning's part number DER 332 treated with Dow Corning's curing agent DEH 24 and an aluminum oxide filler. The layer of transducer material 314 is preferably a piezoelectric material such as HD3203 available from Motorola of New Mexico. Alternatively the layer of transducer material 314 may be a 1–3 composite as is well known to those of ordinary skill in the art. The first acoustic matching layer 316 preferably has a high impedance and is formed of DER 332 and DEH 24 available from Dow Corning plus 9 micron aluminum particles forming a material having a longitudinal velocity of 2064 m/s and a density of 4450 kg/$m^3$. The second acoustic matching layer 318 preferably has a low impedance and is formed of DER 332 and DEH 24 also available from Dow Corning forming a material having a longitudinal velocity of 2630 m/s and a density of 1200 kg/$m^3$. The filler material 320 is preferably nonfocusing, such as urethane, and has an acoustic impedance of about Z=1.7 MRayls. Alternatively, in situations where a sharper shallow focus is needed, a low loss RTV material can be used such as RTV X3-6121 available from Dow Corning preferably modified by adding aluminum oxide ($Al_2O_3$) having 1 μm particle size in order to match the filler material to the acoustics in the body. The nose piece 322 with the integrated faceplate window 323 is preferably formed of a polymer selected from the group consisting of polymethylpentene, polyethylene, an ionomer compound such as Surlyn 9450 or rubber modified version of these materials, as will be described in further detail hereinafter. A polymethylpentene such as TPX MX001™ or TPX MX002™, available from Mitsui Petrochemicals (America) Ltd., 250 Park Avenue, Suite 950, New York, N.Y. 10177, is suitable. Polymethylpentene is blood compatible and has an acoustic impedance of about 1.7 MRayls. Alternatively, a low density, high grade polyethylene such as LDPE-4012 available from Dow Plastic is suitable. Polyethylene also has an acoustic impedance of about 1.7 MRayls but is not blood compatible.

If it is desired to lower the acoustic impedance of either polymethylpentene or polyethylene to about 1.5 MRayls, rubber may be added in the form of rubber pellets. The rubber may be natural rubber or EPDM available from Union Carbide of New York. U.S. Pat. No. 3,256,367 describes modifying polyethylene with rubber and is hereby specifically incorporated by reference. Table 1, below, illustrates the properties for the various materials that may be used to form the nose piece 322 with an integrated faceplate window 323. The first column 340 illustrates the properties of Surlyn 9450, the second column 342 illustrates the properties of polymethylpentene TPX MX002™, the third column 344 illustrates the properties of low density polyethylene LDPE 4012, and the fourth column 346 illustrates the desirable ranges which can be achieved by modifying the materials disclosed in the other columns with rubber, if necessary.

TABLE 1

Integrated Faceplate Window Material

| Material Property | Surlyn 9450 | Polymethyl-pentene TPX MX002 | Low density Polyethylene LDPE 4012 | desirable range |
|---|---|---|---|---|
| Acoustic Impedance (Rayls × $10^6$) | 1.84 | 1.591 | 1.725 | 1.7–1.5 |
| Tensile Strength at Yield (Psi) | 3100 | 2150 | 1500 | 1800–1500 |
| Sound Speed C (meter/second × $10^3$) | 1.96 | 1.905 | 1.896 | 1.700–1.400 |
| Hardness Shore D | 54 | 35 | 47 | .40 |
| Impacted Strength iZod (ft-lb/in) | no break | 0.8–2 | 0.8–1.8 high molecular weight = 30 | 0.8–30 |
| Breakdown Voltage (v/mil) | 1000 | 700 | 480 | 600–500 |
| One way attenuation (dB/mm) | | | | |
| 2 Mhz | 1.29 | 0.36 | 0.63 | 0.5 |
| 5 Mhz | 3.2 | 0.88 | 2.66 | 1 |
| 7 Mhz | 3.7 | 1.22 | 4.5 | 1.5 |

The physical dimensions of the following parts of the transducer assembly 310 will now be described. The blocking block 312 has a width measured in the x-elevation direction of 14 mm, a length measured in the y-azimuth direction of 19 mm and a thickness measured in the z-range direction of 20 mm. The layer of transducer material 314 has a width measured in the x-elevation direction of 14 mm and a length measured in the y-azimuth direction of 19 mm. It has a minimum thickness of 0.0145 inches and a maximum thickness of 0.026 inches. Acoustic matching layers 316 and 318 have a width measured in the x-elevation direction of 14 mm and a length measured in the y-azimuth direction of 19 mm. Acoustic matching layer 316 has a minimum thickness of 0.0065 inches and a maximum thickness of 0.0117 inches. Acoustic matching layer 318 has a minimum thickness of 0.0074 inches and a maximum thickness of 0.0129 inches. The integrated faceplate window 323 has a thickness measured in the z-range direction of 0.025 inches. The radius of curvature of the layer of transducer material 314 is about 81 mm.

The nosepiece with integrated faceplate may be formed by machining a block of material that will form the nosepiece. In particular, a cavity is formed in which the transducer array will be disposed and the outside of the nosepiece is machined to a desired configuration. Alternatively, the nosepiece and integrated faceplate may be formed by injection molding. In the preferred embodiment shown in FIG. 3, the filler material 320 is injected inside the nosepiece and the transducer array is pushed into the cavity of the nosepiece. The filler material bonds the transducer assembly to the nosepiece.

Figure 4:
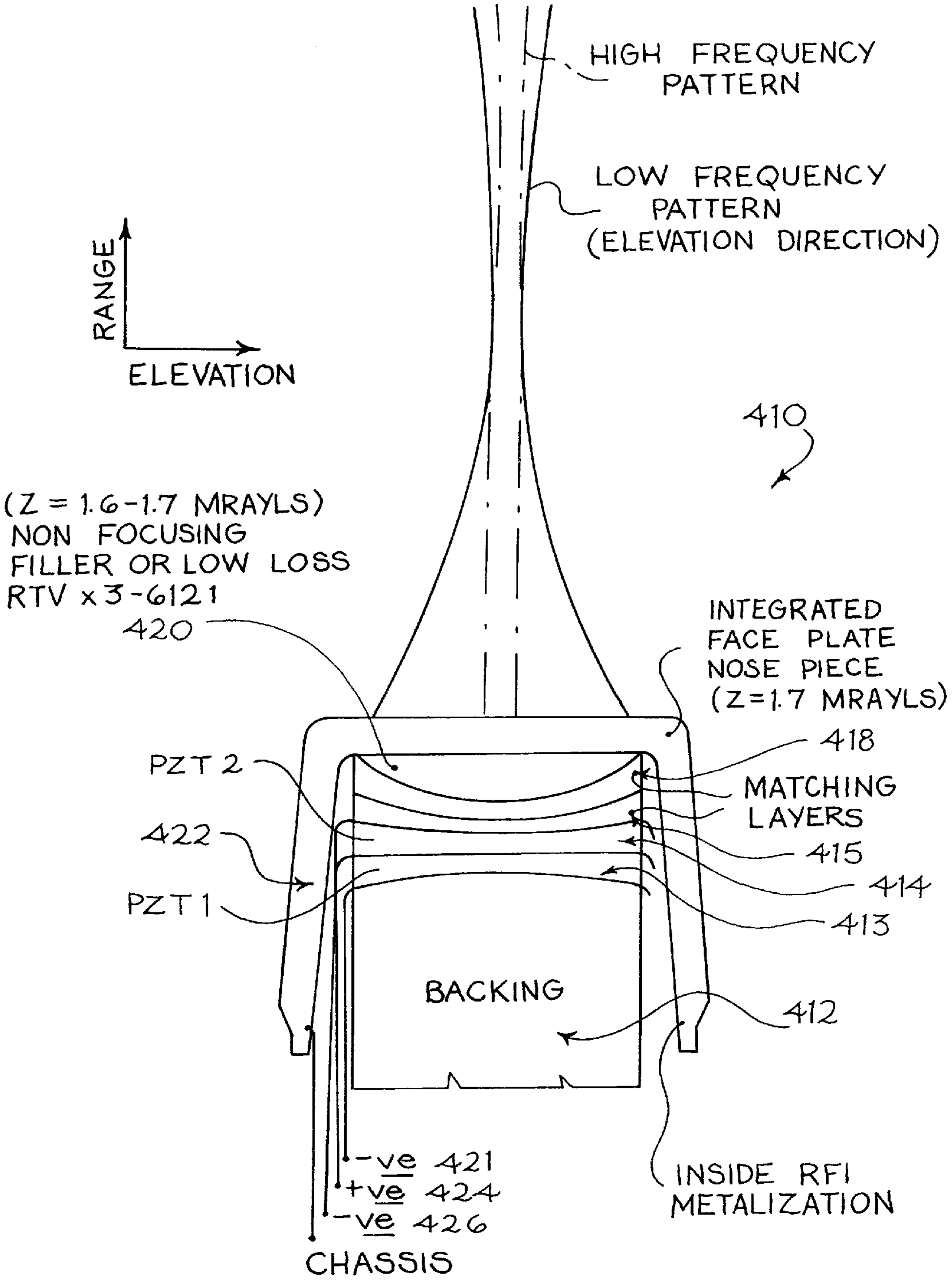
FIG. 4 is a cross-sectional view taken along the x-elevation axis of a transducer assembly according to a second preferred embodiment of the present invention.

FIG. 4 is a cross-sectional view taken along the x-elevation axis of a transducer assembly according to a second preferred embodiment of the present invention. The transducer assembly 410 shown in FIG. 4 has many of the same components as the assembly 310 shown in FIG. 3 except that the transducer assembly 410 includes both a first and a second layer of transducer material 413, 414 respectively. The transducer shown in FIG. 4 is particularly suited for a high sensitivity application. Both layers 413, 414 have a non-uniform thickness along the z-range axis. The ’175 patent referred to earlier discloses a transducer assembly having two layers of non-uniform thickness transducer material. Because two layers of transducer material are used, an additional flex circuit 421 must also be incorporated as shown. In this preferred embodiment the filler material 420 may be a non-focusing material such as urethane or it may be a slightly focusing material such as RTV x3-6121 available from Dow Corning. The dimensions of the transducer shown in FIG. 4 are the same as that shown in FIG. 3 except that the layer of transducer material has been split in two pieces, one half of which has its curved surface facing the region of examination when the transducer is in use and the other half having its curved surface facing the backing block.

Figure 5:
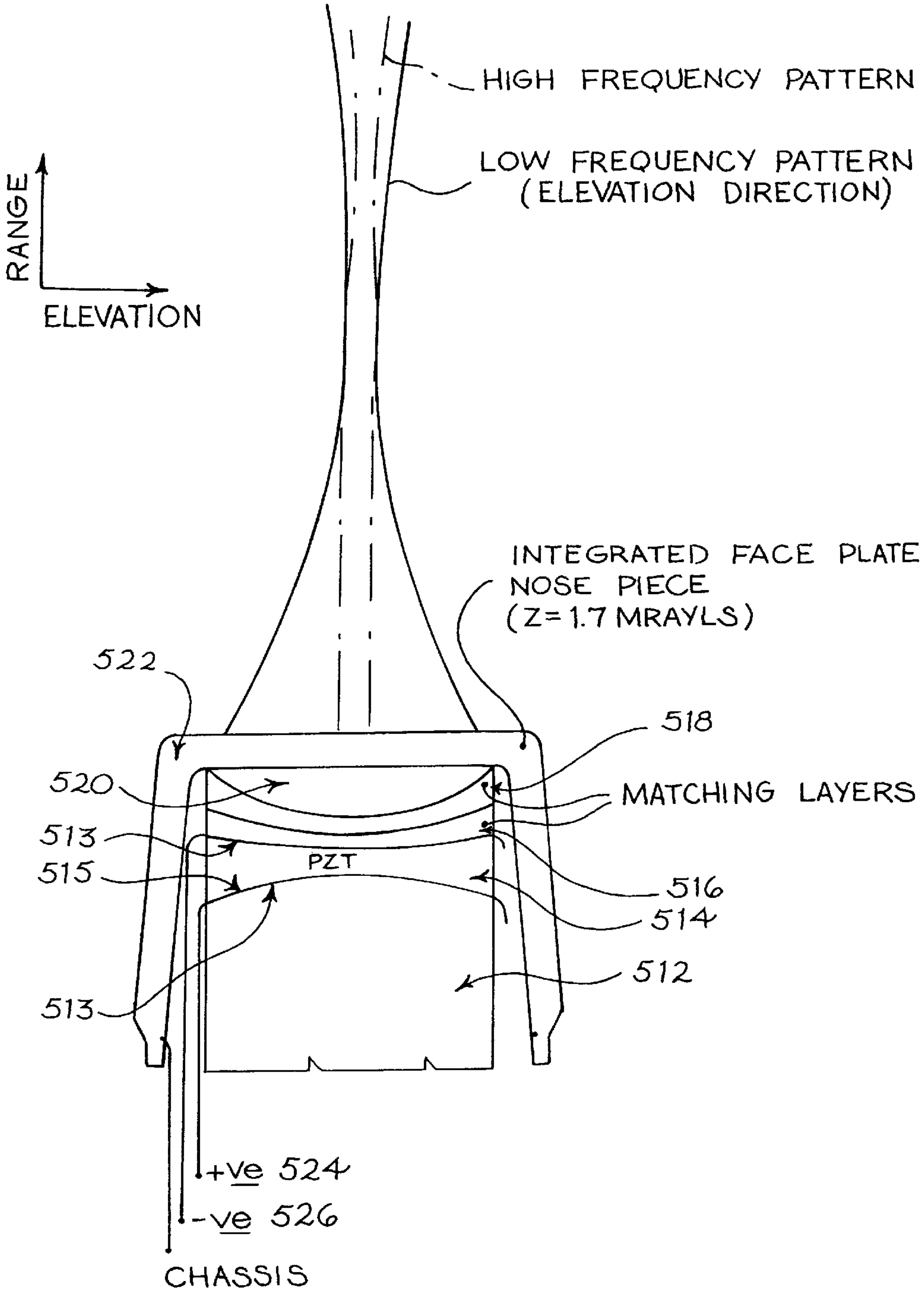
FIG. 5 is a cross-sectional view taken along the x-elevation axis of a transducer assembly according to a third preferred embodiment of the present invention.

FIG. 5 is a cross-sectional view taken along the x-elevation axis of a transducer assembly according to a third preferred embodiment of the present invention. In this preferred embodiment, the layer of transducer material 514 has both a curved front surface 515 and a curved back surface 515. By providing a curved or non-planar front and back surface, an extra wideband ultrasound transducer is realized. The filler material 520 may be a non-focusing material such as urethane, or it may be a low loss material such as RTV X3-6121. The dimensions of the transducer shown in FIG. 5 are preferably as follows. The layer of transducer material 514, and first and second acoustic matching layers 516, 518 have the same width and length as those described in FIG. 3. The layer of transducer material 514 has a minimum thickness of about 0.0145 inches and a maximum thickness of about 0.0338 inches. Acoustic matching layer 518 has a minimum thickness of about 0.0074 inches and a maximum thickness of 0.01677 inches.

The radius of curvature of the front and back surfaces 513, 515 of the layer of transducer material 514 is preferably about 98.125 mm.

Figure 6:
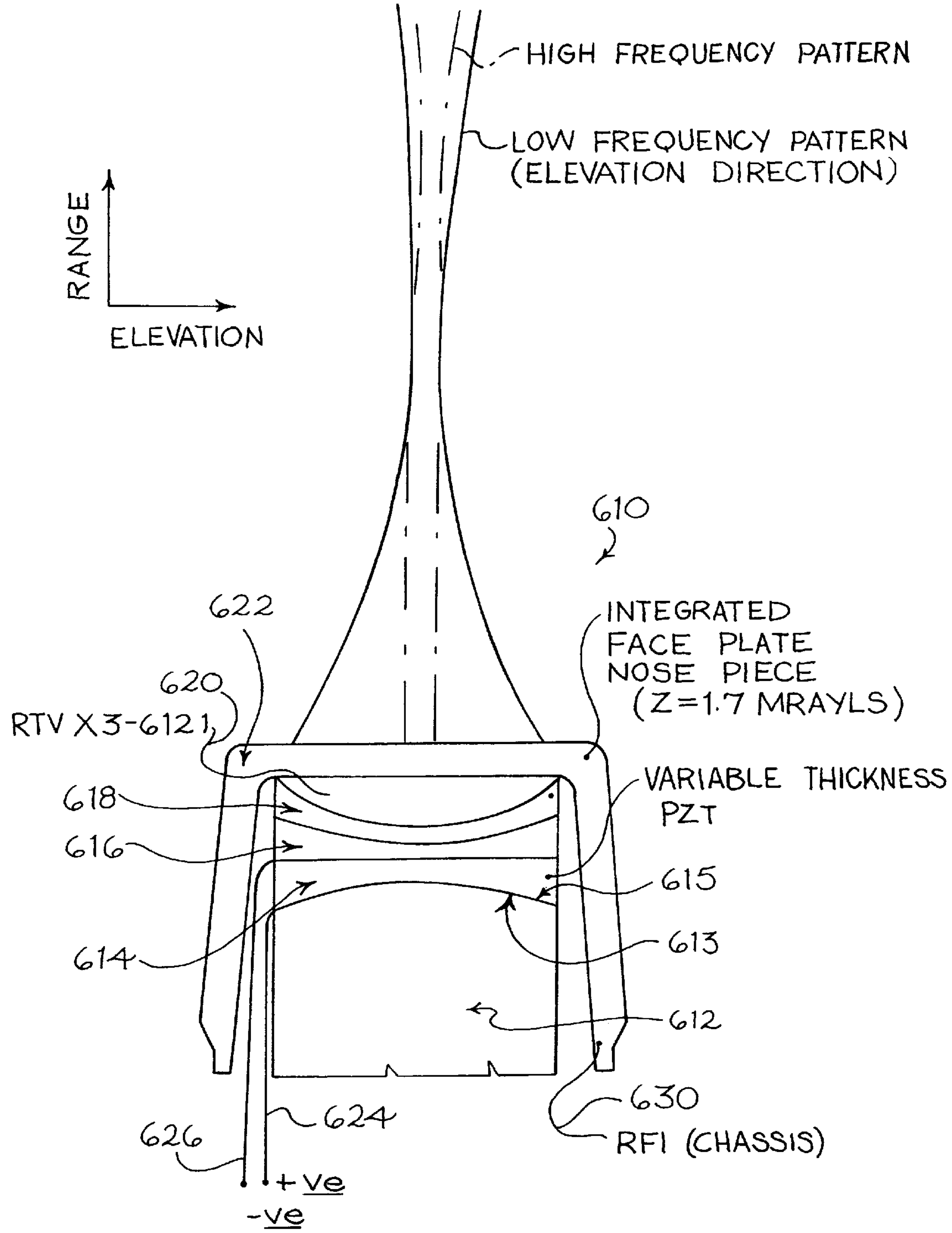
FIG. 6 is a cross-sectional view taken along the x-elevation axis of a transducer assembly according to a fourth preferred embodiment of the present invention.

FIG. 6 is a cross-sectional view taken along the x-elevation axis of a transducer assembly according to a fourth preferred embodiment of the present invention. In this preferred embodiment, the layer of transducer material has a non-uniform thickness along the z-range axis, however, in comparison to the transducer assembly 310 shown in FIG. 3, the orientation of the transducer layer 614 is reversed so that its curved surface 615 faces away from a region of examination when the transducer is in use. In order to accommodate this orientation of the layer of transducer material 614, the backing block 612 has a top surface 613 that is convex in shape. In this preferred embodiment the filler material 620 needs to have strong focusing properties because the inverted transducer layer 614 produces a divergent beam. Preferably the filler material 620 is a low loss RTV material such as X3-6121 available from Dow Corning.

Figure 7:
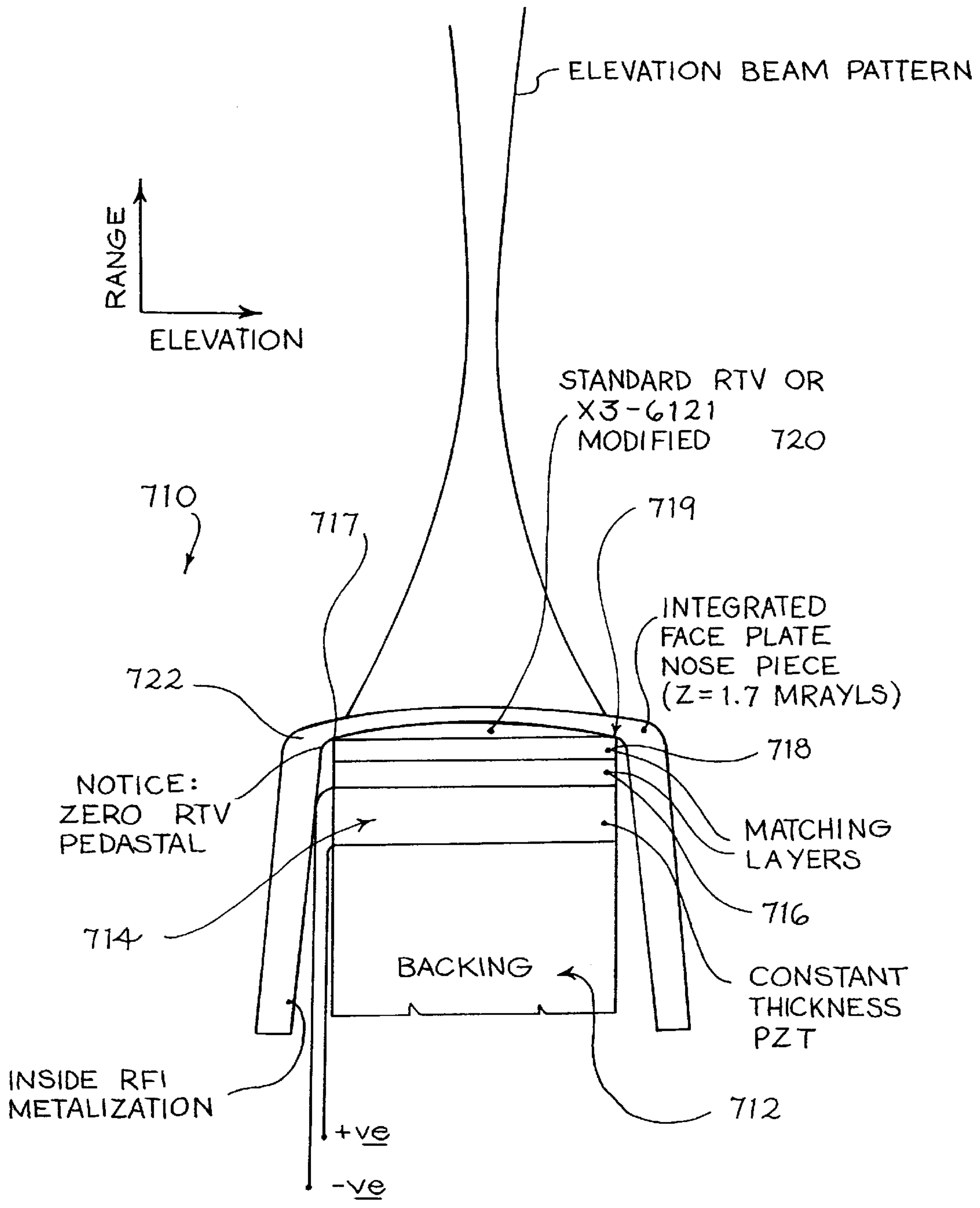
FIG. 7 is a cross-sectional view taken along the x-elevation axis of a transducer assembly according to a fifth preferred embodiment of the present invention.

FIG. 7 is a cross-sectional view of a transducer assembly taken along the x-elevation axis according to a fifth preferred embodiment of the present invention. All of the previously described preferred embodiments incorporated a layer of transducer material that had a non-uniform thickness in the z-range direction. In this preferred embodiment as well as that which will be described with reference to FIG. 8, the layer of transducer material 714 has a constant or uniform thickness at every point along the x-elevation axis. In order to provide focusing of an emitted ultrasound beam in the x-elevation direction, the filler material 720 between the integrated faceplate 723 and the second acoustic matching layer 718 is formed of a focusing material such as standard RTV or modified X3-6121. An advantage of a transducer assembly formed according to this preferred embodiment is that the filler material 720 at a first and second end 717 and 719, i.e., pedestal, is removed which provides for higher sensitivity of the transducer. The dimensions of the transducer shown in FIG. 7 are preferably as follows. The width and lengths of the layer of transducer material 714, first and second acoustic matching layers 716, 718 are the same as that described with reference to FIG. 3. The thicknesses of these layers are, however, constant. The layer of transducer material preferably has a thickness measured in the z-range direction of 0.012 inches, the first acoustic matching layer 716 has a thickness of 0.007 inches and the second acoustic matching layer has a thickness of 0.006 inches. The thickness of the integrated faceplate window 720 is the same as that described with reference to FIG. 3.

Figure 8:
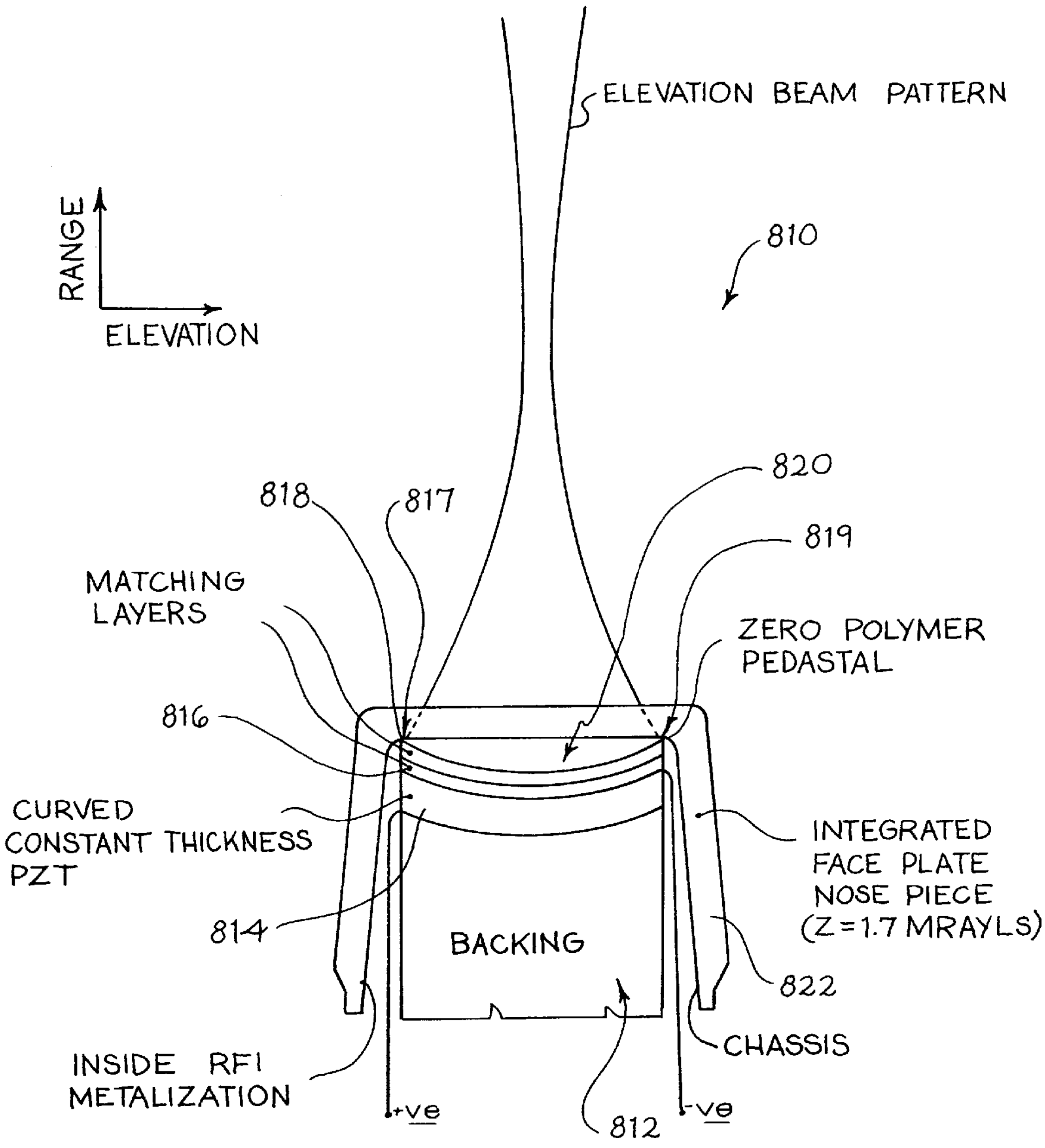
FIG. 8 is a cross-sectional view taken along the x-elevation axis according to a sixth preferred embodiment of the present invention.

FIG. 8 is a cross-sectional view of a transducer assembly taken along the x-elevation axis according to a sixth preferred embodiment of the present invention. Like the transducer 710 shown in FIG. 7, the layer of transducer material 810 has a uniform thickness measured along the z-range axis, however, the layer of transducer material 810 is curved. In this preferred embodiment, the filler material 820 is preferably a non-focusing material such as urethane. As with the transducer assembly shown in FIG. 7, the pedestal at each end 817, 819 of the filler material is removed.

Figure 9:
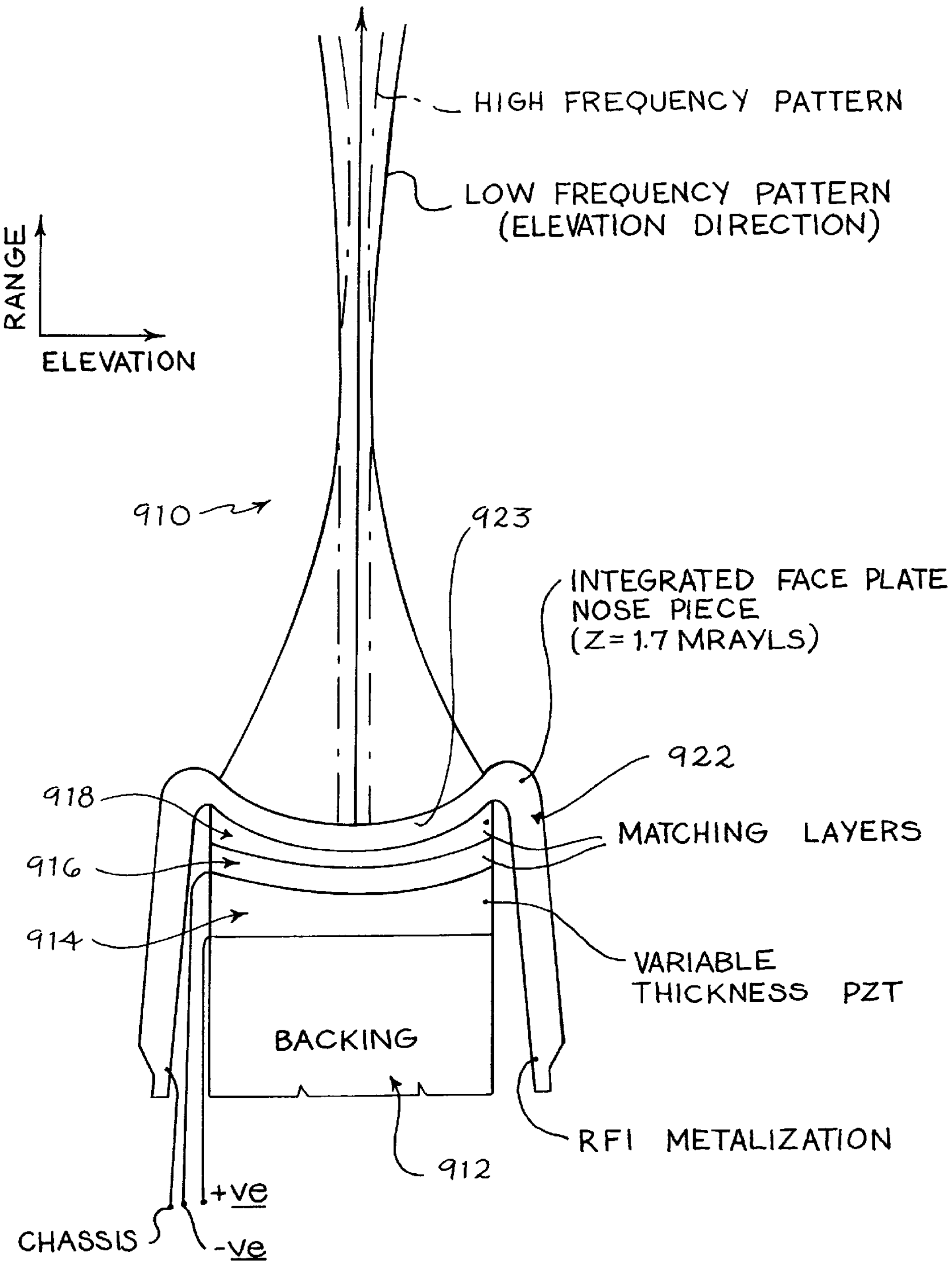
FIG. 9 is a cross-sectional view of a transducer assembly taken along the x-elevation axis according to a seventh preferred embodiment of the present invention.

FIG. 9 is a cross-sectional view of a transducer assembly taken along the x-elevation axis according to a seventh preferred embodiment of the present invention. In the previously described transducer assemblies, a filler material was disposed between the integrated faceplate window of the nosepiece and the second acoustic matching layer. In this preferred embodiment, as well as those that will be described with reference to FIGS. 10–11, the filler material is removed except for a small amount which is needed to bond the transducer assembly and nosepiece. Preferably an impedance matched urethane is used. The transducer assembly 910 includes a nonuniform thickness layer of transducer material 914 like that shown in FIG. 3 with its non-planar surface facing a region of examination when the transducer is in use. A first and a second acoustic matching layer 916, 918 also having non-uniform thickness are disposed on the layer of transducer material 914. Because a filler material is only used as a bonding agent in this preferred embodiment, the integrated faceplate conforms to the concave surface of the second acoustic matching layer 918. The dimensions of the layer of transducer material 914, first and second acoustic matching layers 916 and 918 are the same as described with reference to FIG. 3. The integrated faceplate nosepiece 922 preferably has a uniform thickness of 0.20 inches in the active window region 923 and a thickness of 0.040 inches in the non-active region.

Figure 10:
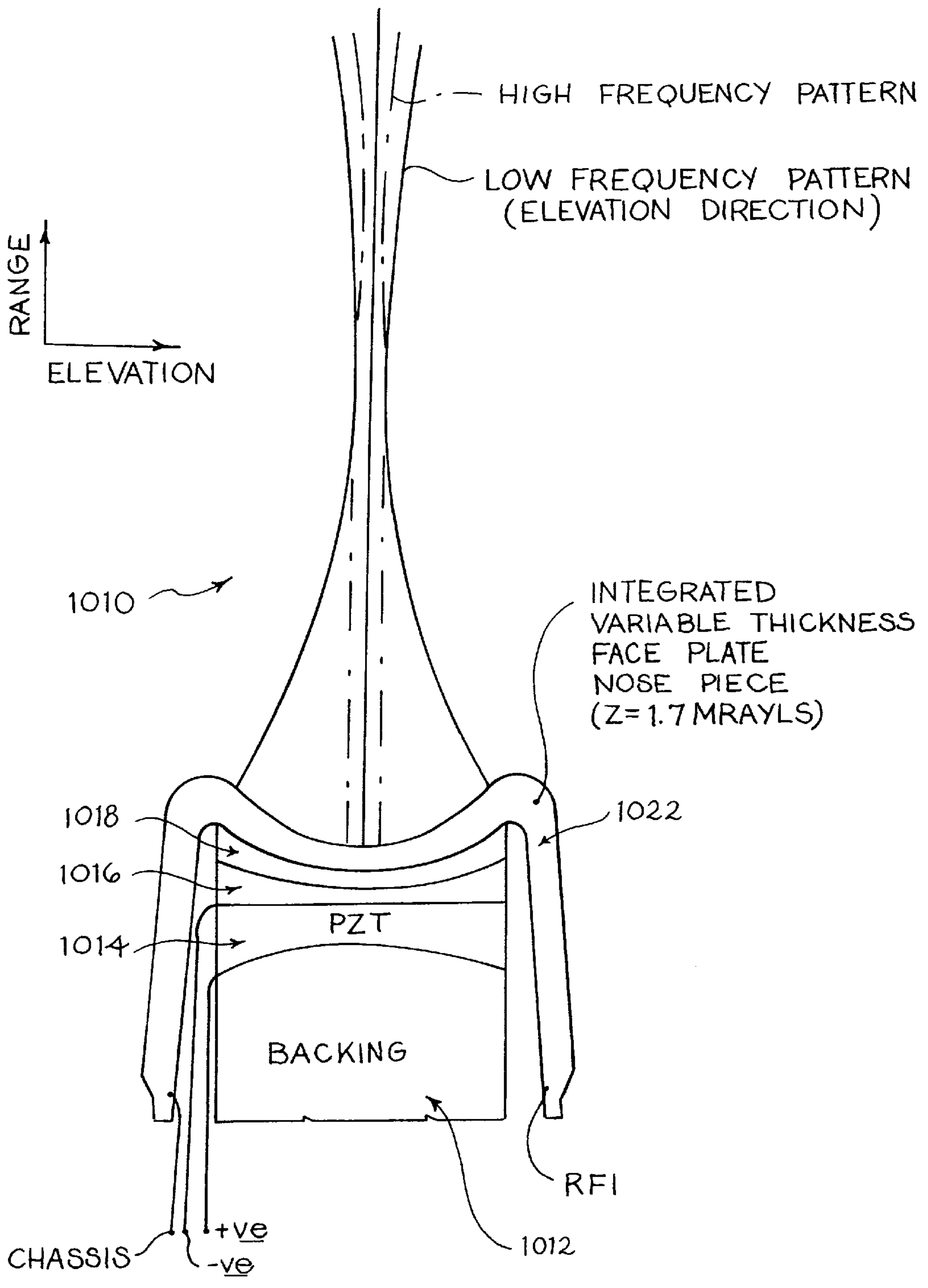
FIG. 10 is a cross-sectional view of a transducer assembly taken along the x-elevation direction according to an eighth preferred embodiment of the present invention.

FIG. 10 is a cross-sectional view of a transducer assembly taken along the x-elevation direction according to an eighth preferred embodiment of the present invention. FIG. 10 is similar to FIG. 9 except that the layer of transducer material 1014 is flipped so that its curved surface faces away, from a region of examination when the transducer is in use. It has the same dimensions as the transducer shown in FIG. 9 except that the integrated faceplate piece has a non-uniform thickness in the active window region 1023 preferably of 0.020 inches in the middle of the active region and a thickness of 0.040 inches at the ends of the active region to compensate for defocusing effect of the backward facing layer of transducer material.

Figure 11:
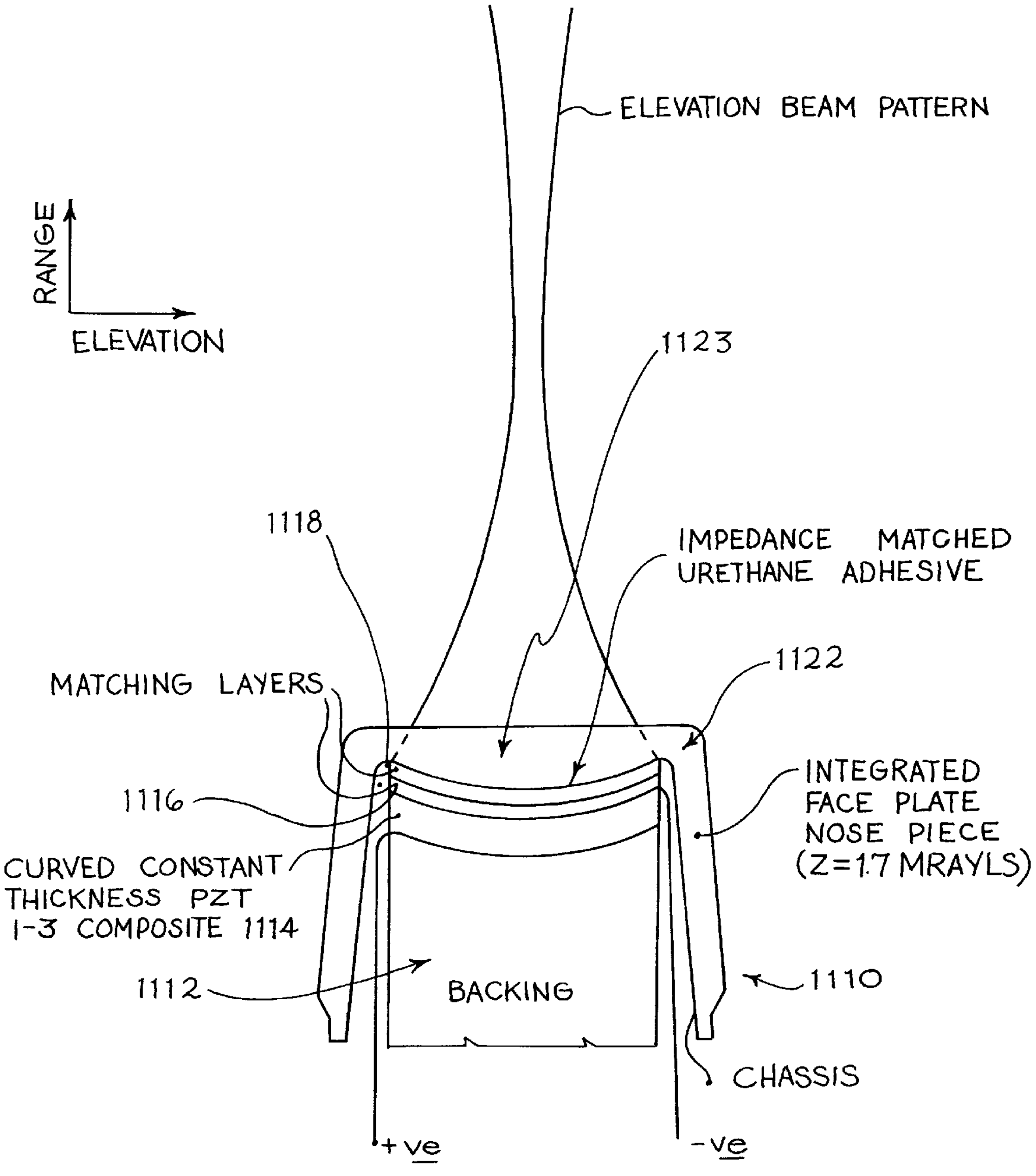
FIG. 11 is a cross-sectional view of a transducer assembly taken along the x-elevation direction according to a ninth preferred embodiment of the present invention.

FIG. 11 is a cross-sectional view of a transducer assembly taken along the x-elevation direction according to a ninth preferred embodiment of the present invention. Unlike the embodiment shown in FIG. 9, the layer of transducer material 1114 and the first and second acoustic matching layers 1116, 1118 are of uniform thickness. The nosepiece 1122 with the integrated faceplate 1123 is disposed directly on the second acoustic matching layer 1118, however, unlike the integrated faceplate shown in FIG. 9, the inner surface of the integrated faceplate 1123 shown in FIG. 11 does conform to the surface of the acoustic matching layer 1118 but the exterior surface of the integrated faceplate 1123 is planar. Because the integrated window 1123 is of variable thickness it creates a defocusing effect which is compensated for by bending the layer of transducer material and acoustic matching layers more to provide a sharper focus. In a preferred embodiment the layer of transducer material 1114 has a thickness of about 0.010 inches and the first and second acoustic matching layers 1116, 1118 each have a thickness of about 0.003 inches. The layer of transducer material 1114 and acoustic matching layers 1116, 1118 have a width measured in the x-elevation direction preferably of 4.0 mm since in this preferred embodiment the transducer is designed to operate at a center frequent of 7 MHertz. The radius of curvature of the layer of transducer material and acoustic matching layers is preferably about 11.0 mm. The minimum thickness of the integrated faceplate at each end of the transducer assembly is about 0.35 mm.

An advantage of the present invention is that a transducer assembly is provided that allows liquid submersibility for easy sterilization, permitting use in surgical applications or in any procedure in which cleaning and disinfecting after exposure to body fluids is required.

It is to be understood that the forms of the invention described herewith are to be taken as preferred examples and that various changes in the shape, size and arrangement of parts may be resorted to without departing from the spirit of the invention or scope of the claims.

What is claimed is:

1. An ultrasound transducer comprising:

a plurality of transducer elements, each of said elements comprising a first layer of transducer material, the first layer having a first surface and a second surface opposite of the first surface and a thickness measured in a range direction between the first and second surface wherein the thickness of the first layer is non-uniform;

a nosepiece having an integrated faceplate disposed over the plurality of transducer elements; and a filler material disposed between the plurality of transducer elements and the integrated faceplate.

2. An ultrasound transducer according to claim 1 wherein said first surface is generally non-planar in an elevation direction and faces away from a region of examination when the transducer is in use.

3. An ultrasound transducer according to claim 1 wherein said first surface is generally non-planar in an elevation direction and faces toward a region of examination when the transducer is in use.

4. An ultrasound transducer according to claim 3 further comprising at least a first acoustic matching layer disposed directly on the first surface of each of the plurality of transducer elements.

5. An ultrasound transducer according to claim 4 further comprising a second acoustic matching layer disposed directly on the first acoustic matching layer.

6. An ultrasound transducer according to claim 2 wherein the filler material has focusing properties.

7. An ultrasound transducer according to claim 3 wherein the filler material is non-focusing.

8. An ultrasound transducer according to claim 1 further comprising a second layer of transducer material disposed on the first layer of transducer material, the second layer having a first surface and a second surface opposite of the first surface and a thickness measured in a range direction between the first and second surface wherein the thickness of the second layer is non-uniform.

9. An ultrasound transducer according to claim 3 wherein the second surface is planar in the elevation direction.

10. An ultrasound transducer according to claim 3 wherein the second surface is non-planar in the elevation direction.

11. An ultrasound transducer according to claim 9 or 10 wherein the second surface of the second layer faces away from a region of examination when the transducer is in use.

12. An ultrasound transducer according to claim 8 wherein said first surface of said second layer is generally non-planar and faces away from the region of examination when the transducer is in use.

13. An ultrasound transducer according to claim 1 wherein the nosepiece and integrated faceplate is formed from a polymer selected from the group consisting of polymethylpentene, low density high grade polyethylene, rubber modified polymethylpentene, and an ionomer compound.

14. An ultrasound transducer according to claim 7 wherein the filler material is a polyurethane.

15. An ultrasound transducer according to claim 6 wherein the filler material is a silicon.

16. An ultrasound transducer according to claim 1 wherein said transducer material is a piezoelectric ceramic.

17. An ultrasound transducer according to claim 1 wherein said transducer material is a 1–3 composite.

18. An ultrasound transducer according to claim 1 wherein each transducer element has a minimum thickness located at about a center of each of the plurality of transducer elements and each transducer element has a maximum thickness located at each end of each transducer element.

19. An ultrasound transducer comprising:

a plurality of transducer element disposed on a top surface of a backing block, the plurality of transducer elements each having a first surface and a second surface, wherein the second surface is opposite of the first surface and the first surface is non-planar in an elevation direction;

a nosepiece having an integrated faceplate disposed over the plurality of transducer elements; and a filler material disposed between the plurality of transducer elements and the integrated faceplate.

20. An ultrasound transducer according to claim 19 wherein said first surface faces away from a region of examination when the transducer is in use.

21. An ultrasound transducer according to claim 19 wherein said first surface faces toward a region of examination when the transducer is in use.

22. An ultrasound transducer according to claim 21 further comprising a first acoustic matching layer disposed directly on the first surface of each of the plurality of transducer elements.

23. An ultrasound transducer according to claim 22 further comprising a second acoustic matching layer disposed directly on the first acoustic matching layer.

24. An ultrasound transducer according to claim 20 wherein the filler material has focusing properties.

25. An ultrasound transducer according to claim 21 wherein the filler material is non-focusing.

26. An ultrasound transducer according to claim 21 wherein the second surface is planar.

27. An ultrasound transducer according to claim 21 wherein the second surface is non-planar in the elevation direction.

28. An ultrasound transducer according to claim 19 wherein the nosepiece and integrated faceplate is formed from a polymer selected from the group consisting of polymethylpentene, low density high grade polyethylene, rubber modified polymethylpentene, and an ionomer compound.

29. An ultrasound transducer according to claim 19 wherein the nosepiece and integrated faceplate is formed from a material having an acoustic impedance in the range of about 1.4 to 1.9 MRayls.

30. An ultrasound transducer according to claim 25 wherein the filler material is a polyurethane.

31. An ultrasound transducer according to claim 24 wherein the filler material is a silicon.

32. An ultrasound transducer according to claim 19 wherein said transducer material is a piezoelectric ceramic.

33. An ultrasound transducer according to claim 19 wherein said transducer material is a 1–3 composite.

34. An ultrasound transducer according to claim 19 wherein each transducer element has a minimum thickness located at about a center of each of the plurality of transducer elements and each transducer element has a maximum thickness located at each end of each transducer element.

35. An ultrasound transducer according to claim 19 further comprising a second layer of transducer material disposed on the first layer of transducer materials, the second layer having a first surface and a second surface opposite of the first surface and a thickness measured in a range direction between the first and second surface wherein the thickness of the second layer is non-uniform.

36. An ultrasound transducer according to claim 35 wherein the first surface of the second layer faces away from a region of examination when the transducer is in use.

37. An ultrasound transducer according to claim 36 wherein the second surface of the second layer is planar in the elevation direction.

38. An ultrasound transducer according to claim 36 wherein the second surface of the second layer is non-planar in the elevation direction.

39. An ultrasound transducer comprising:

a plurality of transducer elements, each element comprising a back portion facing away from a region of examination, a front portion opposite of the back portion and two side portions, each of the elements having a thickness measured in a range direction between the front and back portion, the thickness being greater at each of the side portions than between the side portions;

a nosepiece having an integrated faceplate disposed over the plurality of transducer elements; and a filler material disposed between the plurality of transducer elements and the faceplate.

40. An ultrasound transducer according to claim 39 wherein said back portion is planar.

41. An ultrasound transducer according to claim 39 wherein said back portion is non-planar.

42. An ultrasound transducer according to claim 41 further comprising at least a first acoustic matching layer disposed directly on the first surface of each of the plurality of transducer elements.

43. An ultrasound transducer according to claim 42 further comprising a second acoustic matching layer disposed directly on the first acoustic matching layer.

44. An ultrasound transducer according to claim 41 wherein the filler material has focusing properties.

45. An ultrasound transducer according to claim 40 wherein the filler material is non-focusing.

46. An ultrasound transducer according to claim 39 wherein the nosepiece and integrated faceplate is formed from a polymer selected from the group consisting of polymethylpentene, low density high grade polyethylene, rubber modified polymethylpentene, and an ionomer compound.

47. An ultrasound transducer according to claim 45 wherein the filler material is a polyethylene.

48. An ultrasound transducer according to claim 44 wherein the filler material is a silicon.

49. An ultrasound transducer according to claim 39 wherein said transducer material is a piezoelectric ceramic.

50. An ultrasound transducer according to claim 39 wherein said transducer material is a 1–3 composite.

51. An ultrasound transducer according to claim 46 further comprising a second layer of transducer material disposed on the first layer of transducer material, the second layer having a first surface and a second surface opposite of the first surface and a thickness measured in a range direction between the first and second surface wherein the thickness of the second layer is non-uniform.

52. An ultrasound transducer according to claim 51 wherein the second surface of the second layer faces away from a region of examination when the transducer is in use.

53. An ultrasound transducer according to claim 52 wherein the second surface of the second layer is planar in the elevation direction.

54. An ultrasound transducer according to claim 52 wherein the second surface of the second layer is non-planar in the elevation direction.

55. An ultrasound transducer comprising:

a plurality of transducer elements, each of the transducer elements comprising a first layer of transducer material, each element having a front surface facing a region of examination that is non-planar in an elevation direction;

a nosepiece having an integrated faceplate disposed over the plurality of transducer elements;

a filler material disposed between the plurality of transducer elements and the integrated faceplate; and a housing coupled with the nosepiece;

wherein the transducer has a front surface facing the region of examination, and wherein the housing is coupled with the nosepiece away from, and not at, the front surface of the transducer.

56. An ultrasound transducer according to claim 55 wherein each of the transducer elements have a thickness measured in a range direction, wherein the thickness of each transducer element at each elevation location of the element is equal.

57. An ultrasound transducer according to claim 55 wherein each of the transducer elements have a thickness measured in a range direction, wherein the thickness of each transducer element at each elevation location of the element is not equal.

58. An ultrasound transducer according to claim 57 wherein the thickness of each transducer element is at a minimum at about a center position and the thickness of each transducer element is at a maximum at each end of the transducer element.

59. An ultrasound transducer according to claim 55 further comprising a first acoustic matching layer disposed directly on the first surface of each of the plurality of transducer elements.

60. An ultrasound transducer according to claim 59 further comprising a second acoustic matching layer disposed directly on the first acoustic matching layer.

61. An ultrasound transducer according to claim 55 wherein the filler material has focusing properties.

62. An ultrasound transducer according to claim 55 wherein each of said elements has a second surface opposite of the first surface wherein the second surface is planar in the elevation direction.

63. An ultrasound transducer according to claim 55 wherein each of said elements has a second surface opposite of the first surface wherein the second surface is non-planar in the elevation direction.

64. An ultrasound transducer according to claim 55 wherein the nosepiece and integrated faceplate is formed from a polymer selected from the group consisting of polymethylpentene, low density high grade polyethylene, rubber modified polymethylpentene, and an ionomer compound.

65. An ultrasound transducer according to claim 61 wherein the filler material is a silicon.

66. An ultrasound transducer according to claim 55 wherein said transducer material is a piezoelectric ceramic.

67. An ultrasound transducer according to claim 55 wherein said transducer material is a 1–3 composite.

68. An ultrasound transducer according to claim 55 wherein the filler material has a thickness measured in a range direction wherein the filler material has a maximum thickness at about a center of each of the plurality of transducer elements and the filler material has a minimum thickness at each end of the plurality of transducer elements.

69. An ultrasound transducer according to claim 68 wherein the minimum thickness is substantially zero.

70. An ultrasound transducer comprising:

a plurality of transducer elements, each of the transducer elements comprising a first layer of transducer material, each element having a front surface facing a region of examination that is non-planar in an elevation direction;

a nosepiece having an integrated faceplate disposed over the plurality of transducer elements; and a housing coupled with the nosepiece;

wherein the transducer has a front surface facing the region of examination, and wherein the housing is coupled with the nosepiece away from and not at, the front surface of the transducer.

71. An ultrasound transducer according to claim 70 wherein each of the transducer elements have a thickness measured in a range direction, wherein the thickness of each transducer element at each elevation location of the element is equal.

72. An ultrasound transducer according to claim 70 wherein each of the transducer elements have a thickness measured in a range direction, wherein the thickness of each transducer element at each elevation location of the element is not equal.

73. An ultrasound transducer according to claim 72 wherein the thickness of each transducer element is at a minimum at about a center position and the thickness of each transducer element is at a maximum at each end of the transducer element.

74. An ultrasound transducer according to claim 70 further comprising a first acoustic matching layer disposed directly on the first surface of each of the plurality of transducer elements.

75. An ultrasound transducer according to claim 74 further comprising a second acoustic matching layer disposed directly on the first acoustic matching layer.

76. An ultrasound transducer according to claim 74 further comprising an adhesive material disposed between the plurality of transducer elements and the integrated faceplate of the nosepiece to bond the transducer elements to the nosepiece.

77. An ultrasound transducer according to claim 70 wherein each of said elements has a second surface opposite of the first surface wherein the second surface is planar in the elevation direction.

78. An ultrasound transducer according to claim 70 wherein each of said elements has a second surface opposite of the first surface wherein the second surface is non-planar in the elevation direction.

79. An ultrasound transducer according to claim 70 wherein the nosepiece and integrated faceplate is formed from a polymer selected from the group consisting of polymethylpentene, low density high grade polyethylene, rubber modified polymethylpentene, and an ionomer compound.

80. An ultrasound transducer according to claim 76 wherein the adhesive material is selected from the group consisting of urethane and silicon.

81. An ultrasound transducer according to claim 70 wherein said transducer material is a piezoelectric ceramic.

82. An ultrasound transducer according to claim 70 wherein said transducer material is a 1–3 composite.

83. An ultrasound transducer according to claim 70 wherein the integrated faceplate of the nosepiece has a uniform thickness, the thickness measured in a range direction.

84. An ultrasound transducer according to claim 70 wherein the integrated faceplate of the nosepiece has a non-uniform thickness, the thickness measured in a range direction.

85. An ultrasound transducer according to claim 83 wherein the integrated faceplate has a front surface which faces a region of examination when the transducer is in use, wherein the front surface of the integrated faceplate is concave.

86. An ultrasound transducer according to claim 83 wherein the integrated faceplate has a front surface which faces a region of examination when the transducer is in use, wherein the front surface of the integrated faceplate is generally planar.

87. An ultrasound transducer according to claim 83 wherein the integrated faceplate has a front surface which faces a region of examination when the transducer is in use, wherein the front surface of the integrated faceplate is convex.

88. An ultrasound transducer comprising:

a plurality of transducer elements, each of the transducer elements comprising a first layer of transducer material, each element having a front surface facing a region of examination that is non-planar in an elevation direction;

a nosepiece having an integrated faceplate disposed over the plurality of transducer elements; and a filler material disposed between the plurality of transducer elements and the integrated faceplate;

wherein the nosepiece and integrated faceplate is formed from a polymer selected from the group consisting of polymethylpentene, low density high grade polyethylene, rubber modified polymethylpentene, and an ionomer compound.

89. An ultrasound transducer comprising:

a plurality of transducer elements, each of the transducer elements comprising a first layer of transducer material, each element having a front surface facing a region of examination that is non-planar in an elevation direction; and a nosepiece having an integrated faceplate disposed over the plurality of transducer elements;

wherein the nosepiece and integrated faceplate is formed from a polymer selected from the group consisting of polymethylpentene, low density high grade polyethylene, rubber modified polymethylpentene, and an ionomer compound.

* * * * *